United States Patent
Koo et al.

(10) Patent No.: US 7,839,675 B2
(45) Date of Patent: Nov. 23, 2010

(54) MAGNETIC MEMORY DEVICE AND METHOD FOR READING MAGNETIC MEMORY CELL USING SPIN HALL EFFECT

(75) Inventors: Hyun Cheol Koo, Seoul (KR); Suk Hee Han, Seoul (KR); Joon Yeon Chang, Seoul (KR); Hyung Jun Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 113 days.

(21) Appl. No.: 12/360,964

(22) Filed: Jan. 28, 2009

(65) Prior Publication Data

US 2010/0027330 A1 Feb. 4, 2010

(30) Foreign Application Priority Data

Aug. 1, 2008 (KR) .................. 10-2008-0075690

(51) Int. Cl.
*G11C 11/18* (2006.01)
*G11C 11/00* (2006.01)
*G11C 11/14* (2006.01)

(52) U.S. Cl. ...................... 365/170; 365/9; 365/158; 365/171

(58) Field of Classification Search .............. 365/170
See application file for complete search history.

(56) References Cited

U.S. PATENT DOCUMENTS

| 5,652,445 | A | * | 7/1997 | Johnson | 257/295 |
| 2009/0154030 | A1 | * | 6/2009 | Yamada et al. | 360/319 |
| 2010/0072993 | A1 | * | 3/2010 | Pan | 324/301 |
| 2010/0097063 | A1 | * | 4/2010 | Ando et al. | 324/316 |

OTHER PUBLICATIONS

Mark Johnson, et al., "Hybrid Hall effect device", 1997, Appl. Phys. Lett. vol. 71, No. 7, pp. 974-976.

* cited by examiner

*Primary Examiner*—Son L Mai
(74) *Attorney, Agent, or Firm*—Renner, Otto, Boisselle & Sklar, LLP

(57) ABSTRACT

A magnetic memory device includes a substrate for reading and a magnetic memory cell. The substrate has a channel layer. The magnetic memory cell is formed on the substrate and has a magnetized magnetic material that transfers spin data to electrons passing the channel layer. Data stored in the magnetic memory cell are read by a voltage across both side ends of the channel layer that is generated when the electrons passing the channel layer deviate in the widthwise direction of the channel layer by a spin Hall effect.

17 Claims, 8 Drawing Sheets

MAGNETIC MEMORY DEVICE AND METHOD FOR READING MAGNETIC MEMORY CELL USING SPIN HALL EFFECT

CROSS-REFERENCE TO RELATED APPLICATIONS

This application claims the priority of Korean Patent Application No. 2008-75690 filed on Aug. 1, 2008, in the Korean Intellectual Property Office, the disclosure of which is incorporated herein by reference.

BACKGROUND OF THE INVENTION

1. Field of the Invention

The present invention relates to reading data stored in a magnetic memory device, and more particularly, to a magnetic memory device and a method for reading a magnetic memory cell using a spin Hall effect, which makes it possible to easily read stored data of a magnetic memory cell by using a spin Hall effect.

2. Description of the Related Art

Many laboratories and enterprises are conducting researches to implement the next-generation memory devices. The next-generation memory devices must have a multi-functional capability and a nonvolatile function of retaining data even when power supply is interrupted. Among the next-generation memory devices, a Magnetic Random Access Memory (MRAM) device is attracting much attention as a new conceptual memory device having the above functions.

A switching operation of the MRAM device is performed using a magnetic field generated by a current or using a spin torque transfer generated by directly injecting a current into a memory cell. A data read operation of the MRAM device is performed by reading a resistance value that changes depending on the arrangement states of a free magnetic layer and a pinned magnetic layer separated by magnetic tunneling junction. This data read operation requires many thin layers for magnetic tunneling. Also, the problem of a damage to a thin layer generated in an etching process during a memory fabrication process and the problems of the high resistance and the stability of a tunneling barrier are remaining to be solved.

SUMMARY OF THE INVENTION

An aspect of the present invention provides a magnetic memory device that makes it possible to easily read stored data of a magnetic memory device by using a spin Hall effect.

Another aspect of the present invention provides a method for reading a magnetic memory cell, which does not necessarily need a magnetic tunneling junction when reading data stored in a magnetic memory cell.

According to an aspect of the present invention, there is provided a magnetic memory device including: a substrate having a channel layer formed therein; and a magnetic memory cell formed on the substrate and having a magnetized magnetic material that transfers spin data to electrons passing the channel layer, wherein data stored in the magnetic memory cell are read by a voltage across both side ends of the channel layer that is generated when the electrons passing the channel layer deviate in the widthwise direction of the channel layer by a spin Hall effect.

The magnetization direction of the magnetic material of the magnetic memory cell may be perpendicular to the top surface of the channel layer. In this case, the electrons with the spin data of the magnetic material is injected from the magnetic material into the channel layer in a read operation of the magnetic memory cell. The deviating direction of the electrons in the widthwise direction of the channel layer changes depending on the spin direction of the injected electrons.

The magnetization direction of the magnetic material of the magnetic memory cell may be in-plane direction of the top surface of the channel layer and may be parallel to the lengthwise direction of the channel layer. In this case, the spin direction of the electrons passing the channel layer is aligned by a stray magnetic field of the magnetic material perpendicular to the top surface of the channel layer in a read operation of the magnetic memory cell. The deviating direction of the electrons in the widthwise direction of the channel layer changes depending on the aligned electron spin direction.

In the read operation of the magnetic memory cell, the polarity of the voltage across the both side ends of the channel layer may change as the deviating direction of the electrons in the widthwise direction of the channel layer changes.

The magnetic material of the magnetic memory cell may be formed of one selected from the group consisting of CoFe, Co, Ni, NiFe, and a combination thereof. Also, the magnetic material of the magnetic memory cell may be formed of one selected from the group consisting of (Ga, Mn)As, (In, Mn)As, and a combination thereof. The magnetic memory cell may have a multilayer structure of ferromagnetic material/tunnel barrier/ferromagnetic material. In another embodiment, the magnetic memory cell may have a single pattern structure of ferromagnetic material.

The channel layer may be a two-dimensional electron gas layer. The two-dimensional electron gas layer may be formed of one selected from the group consisting of GaAs, InAs, InGaAs, InSb, and a combination thereof.

The substrate may include a lower cladding layer and an upper cladding layer for sandwiching the channel layer forming the two-dimensional electron gas layer; the lower cladding layer includes a first lower cladding layer and a second lower cladding layer formed under the first lower cladding layer, the second lower cladding layer having a larger energy band gap than the first lower cladding layer; and the upper cladding layer includes a first upper cladding layer and a second upper cladding layer formed on the first upper cladding layer, the second upper cladding layer having a larger energy band gap than the first upper cladding layer.

The channel layer may be formed of InAs, the first lower cladding layer and the first upper cladding layer may be formed of undoped InGaAs, and the second lower cladding layer and the second upper cladding layer may be formed of undoped InAlAs.

The substrate may have a ridge structure obtained by removing both sides along the lengthwise direction of the channel layer, the channel width may be limited by the ridge structure, and an insulating layer for planarization may be formed at the removed both sides of the ridge structure. Specifically, the ridge structure may have a cross-shaped top portion in such a way that a lengthwise elongated portion and a widthwise elongated portion of the channel layer cross each other, and a voltage across both ends of the widthwise elongated portion may be read as stored data.

According to another aspect of the present invention, there is provided a method for reading data stored in a magnetic memory cell, including: disposing a magnetic memory cell with a magnetized magnetic material on a substrate with a channel layer in order to transfer spin data to electrons passing the channel layer; and reading a voltage across both side ends of the channel layer using a spin Hall effect by the electrons passing the channel layer in a read operation of the magnetic memory cell to read the data stored in the magnetic memory cell.

The magnetization direction of the magnetic material of the magnetic memory cell may be one of a spin-down direction and a spin-up direction perpendicular to the top surface of the channel layer, the electrons with the spin data of the magnetic material may be injected from the magnetic material into the channel layer in the read operation of the magnetic memory cell, and the deviating direction of the electrons injected into the channel layer may change depending on the spin direction of the electrons to read the voltage.

The magnetization direction of the magnetic material of the magnetic memory cell may be in-plane direction of the top surface of the channel layer and may be one of two opposite directions parallel to the lengthwise direction of the channel layer, and a stray magnetic field of the magnetic material perpendicular to the top surface of the channel layer may be used to change the deviating direction of the electrons passing the channel layer according to the spin direction of the electrons, to read the voltage.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

According to embodiments of the present invention, a data read principle of a magnetic memory cell using a spin Hall effect is as follows. The spin Hall effect is a phenomenon that the deviating direction of an electric charge changes depending on the spin direction of an electron by spin-orbit coupling without an external magnetic field. A magnetic memory device according to an embodiment of the present invention may include a semiconductor substrate having a channel layer, a ferromagnetic material, and a metal layer. A two-dimensional electron gas structure in the semiconductor substrate may be implemented in various ways. For example, an InAs channel may be used for the two-dimensional electron gas structure.

Figure 1A:
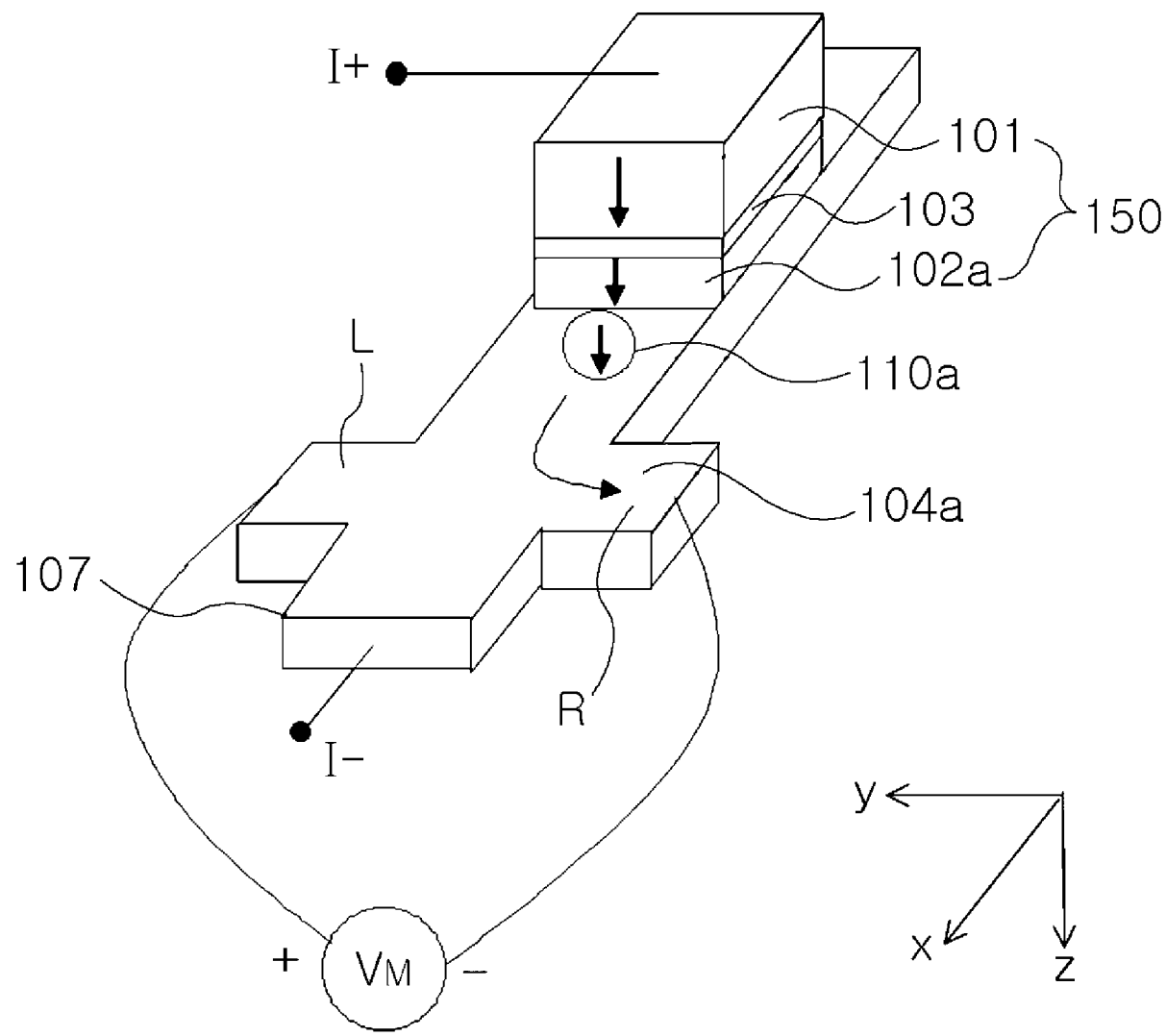
FIGS. 1A and 1B are perspective views illustrating a reading principle of a magnetic memory cell using a spin Hall effect according to an embodiment of the present invention.
Figure 1B:
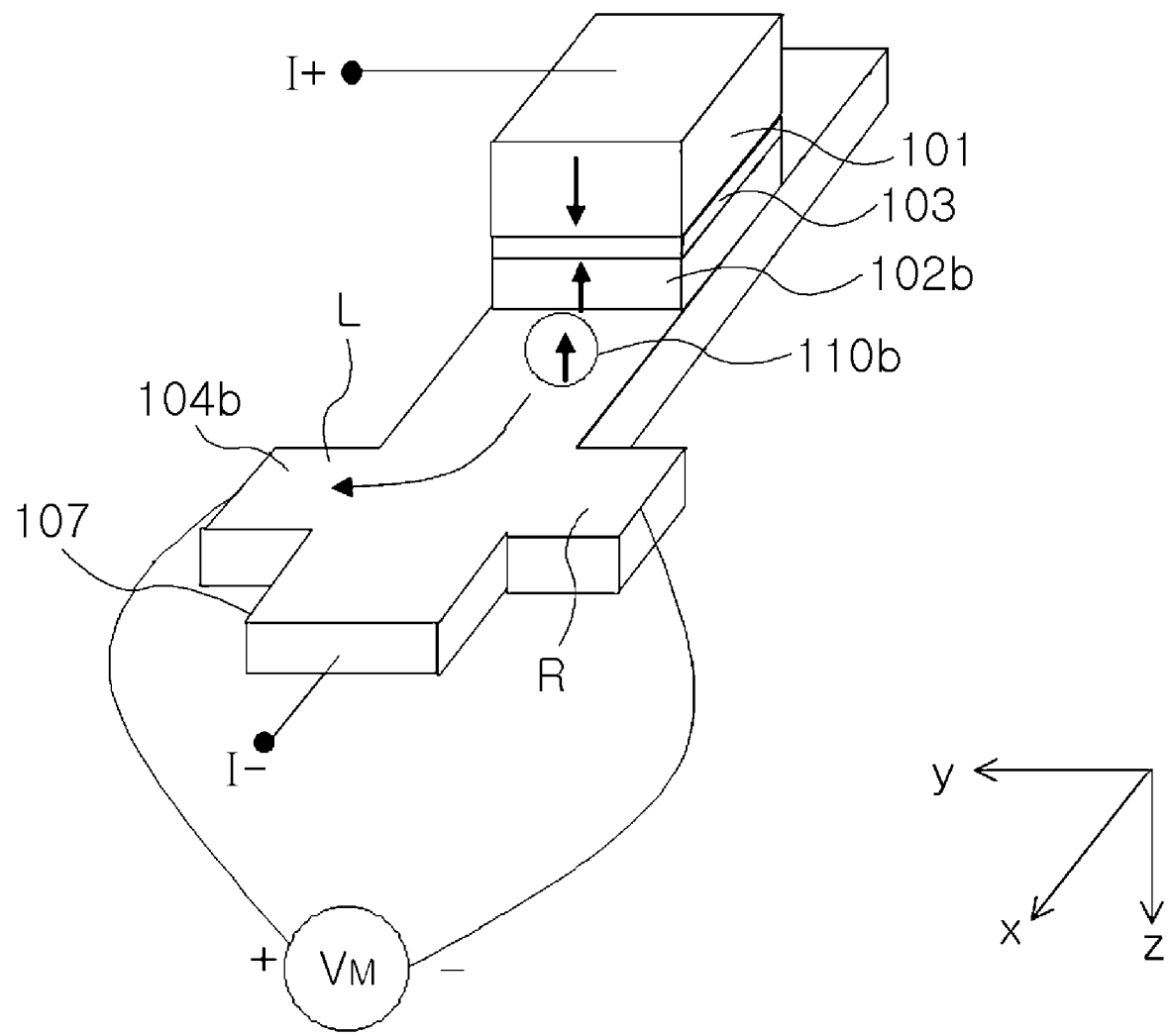

FIGS. 1A and 1B illustrate a case where the magnetization direction of a magnetic substance is the z-axis direction. A write operation of a magnetic memory cell uses a spin transfer torque. The magnetization direction in a pinned layer 101 is fixed, and the magnetization state of free layers 102a and 102b is switched according to the direction of a current (one of the +z direction and the -z direction). A tunneling barrier layer 103 is sandwiched between the pinned layer and the free layer. The pinned layer 101 and the free layers 102A and 102B may be formed of a ferromagnetic material, and the tunneling barrier layer 103 may be formed of an oxide material.

First, when a memory cell is turned on by a transistor for a read operation of the memory cell and thus electrons 110a and 110b with the spin information of a lower magnetic layer are injected into a channel, the electrons 110a and 110b are bent by spin-orbit coupling in the +y direction or the -y direction while passing a channel 107 according to the spin direction. For example, if the spin direction of the free layer 102a is the +z direction as illustrated in FIG. 1A, the electron 110a is bent in the -y direction 104a. If the spin direction of the free layer 102b is the -z direction as illustrated in FIG. 1B, the electron 110b is bent in the +y direction 104b. Accordingly, an asymmetric charge distribution is formed in the y-axis direction and a predetermined voltage (i.e., a spin Hall voltage) is across both ends L and R of channel width in a steady state.

As described above, in implementation of the magnetic memory device, the storage state of the magnetic memory cell can be easily read using the spin Hall effect. In the magnetic memory cell read operation, the stored data can be read by a positive or negative voltage and thus a reference voltage is unnecessary. Using this phenomenon, the magnetization direction of the magnetic memory cell can be electrically read without a complex magnetic tunneling junction, when considering only a data read operation. This phenomenon can be used when the electron passing the channel 107 spins in the direction perpendicular to a plane (i.e., the top surface of the channel). This vertical spin of the electron may be implemented using the vertical magnetization of the magnetic material as in the above embodiments (FIGS. 1A and 1B), or may be implemented using a vertical magnetic field leaking in horizontal magnetization. The vertical magnetization of the magnetic material may be implemented using a vertical magnetization material, or may be implemented using a multilayer structure formed by alternate lamination of ferromagnetic layers and nonmagnetic layers.

In the result, the deviating path of the electrons changes according to the arrangement direction of the spin and this can be easily measured using a voltage. The spin Hall effect is a phenomenon that occurs in a metal channel as well as in a semiconductor channel with a good electron mobility. The spin Hall effect can diversify materials and does not necessary require a magnetic tunneling junction in a data read operation, thus making it possible to simplify the fabrication process.

When measuring a voltage (i.e., a spin Hall voltage $V_M$) across both ends in width direction of the channel 107 in the structures of FIGS. 1A and 1B, the stored data can be read by a positive voltage value in the case of FIG. 1A and the stored data can be read by a negative voltage value in the case of FIG.

1B. Herein, although the data storage or writing operation can use various magnetic memory storage methods, FIGS. 1A and 1B illustrates the case where the magnetization direction is controlled by the magnetization direction of a current by using a spin transfer torque. The illustration of a connection state of transistors and a metal line (bit line) on the top of the magnetic memory device is omitted for convenience in description.

Figure 2A:
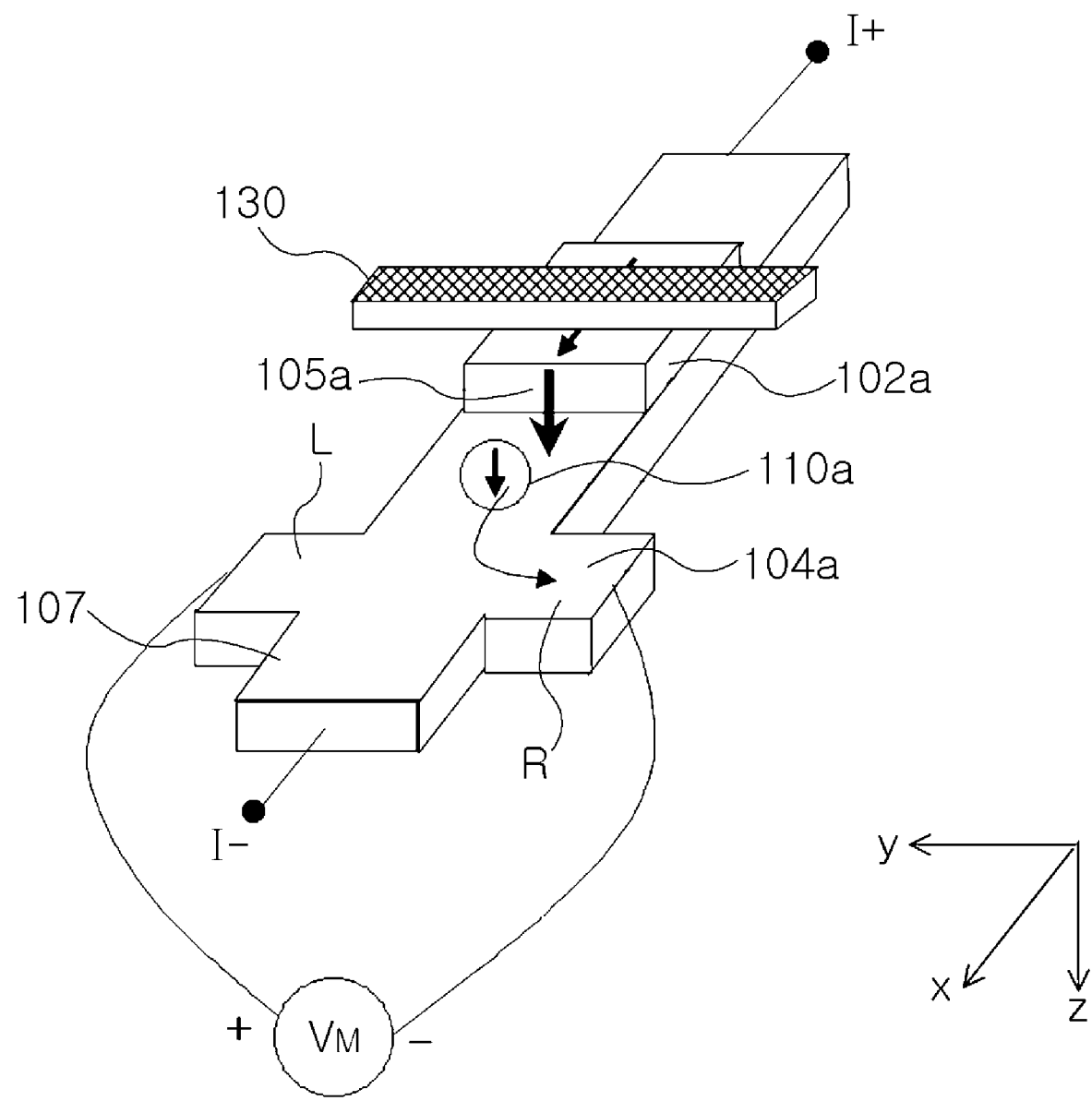
FIGS. 2A and 2B are perspective views a reading principle of a magnetic memory cell using a spin Hall effect according to another embodiment of the present invention.
Figure 2B:
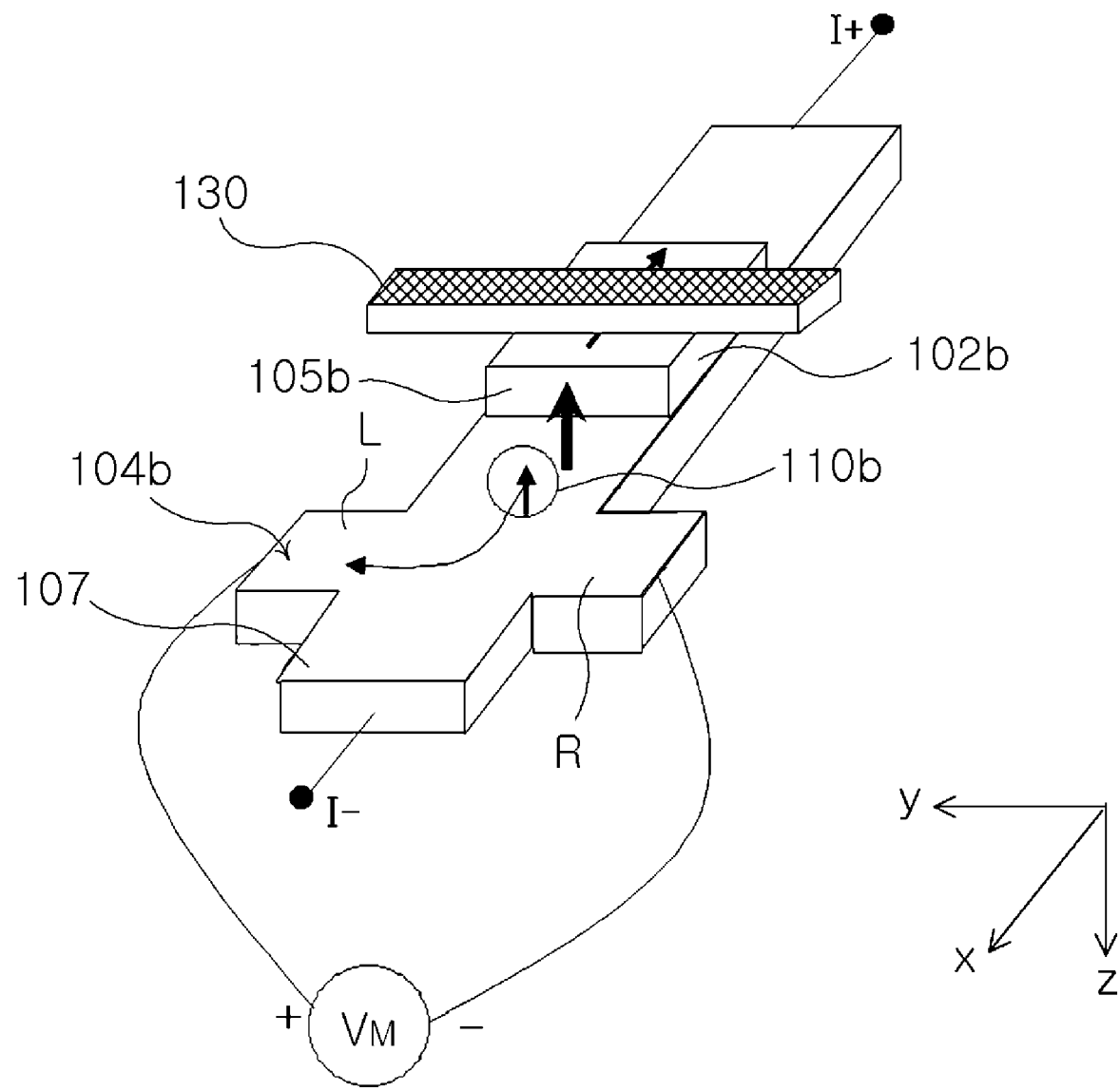

The data read method using a spin Hall illustrated in FIGS. 1A and 1B may be similarly used when the magnetization direction of the free layers 102a and 102b is parallel to the x-axis direction. As illustrated in FIG. 2A, when the magnetization direction of the free layer 102a is the +x direction, a stray magnetic field 105a generated in the magnetic material is generated in the +z direction in the channel 107 (the spin is aligned according the stray magnetic field), an electron 110a deviates in the −y direction 104a, and the spin Hall voltage $V_M$ has a positive voltage value. On the contrary, as illustrated in FIG. 2B, when the magnetization direction of the free layer 102b is the −x direction, a stray magnetic field 105b is generated in the −z direction in the channel 107, an electron 110b deviates in the +y direction 104b, and a voltmeter can read a negative voltage across both ends L and R of channel width direction. At this point, in order to prevent the spin of the +x direction from being directly injected into the channel 107, the current is applied only to the channel 107 without passing the junction between the magnetic free layer 102a and the channel. In this case, the magnetization direction of the free layer 102b may be switched using a metal line 130. It is preferable that the ferromagnetic free layer 102a elongates sufficiently so that the spin of the electron passing the channel layer can be accurately aligned by the stray magnetic field.

Figure 3A:
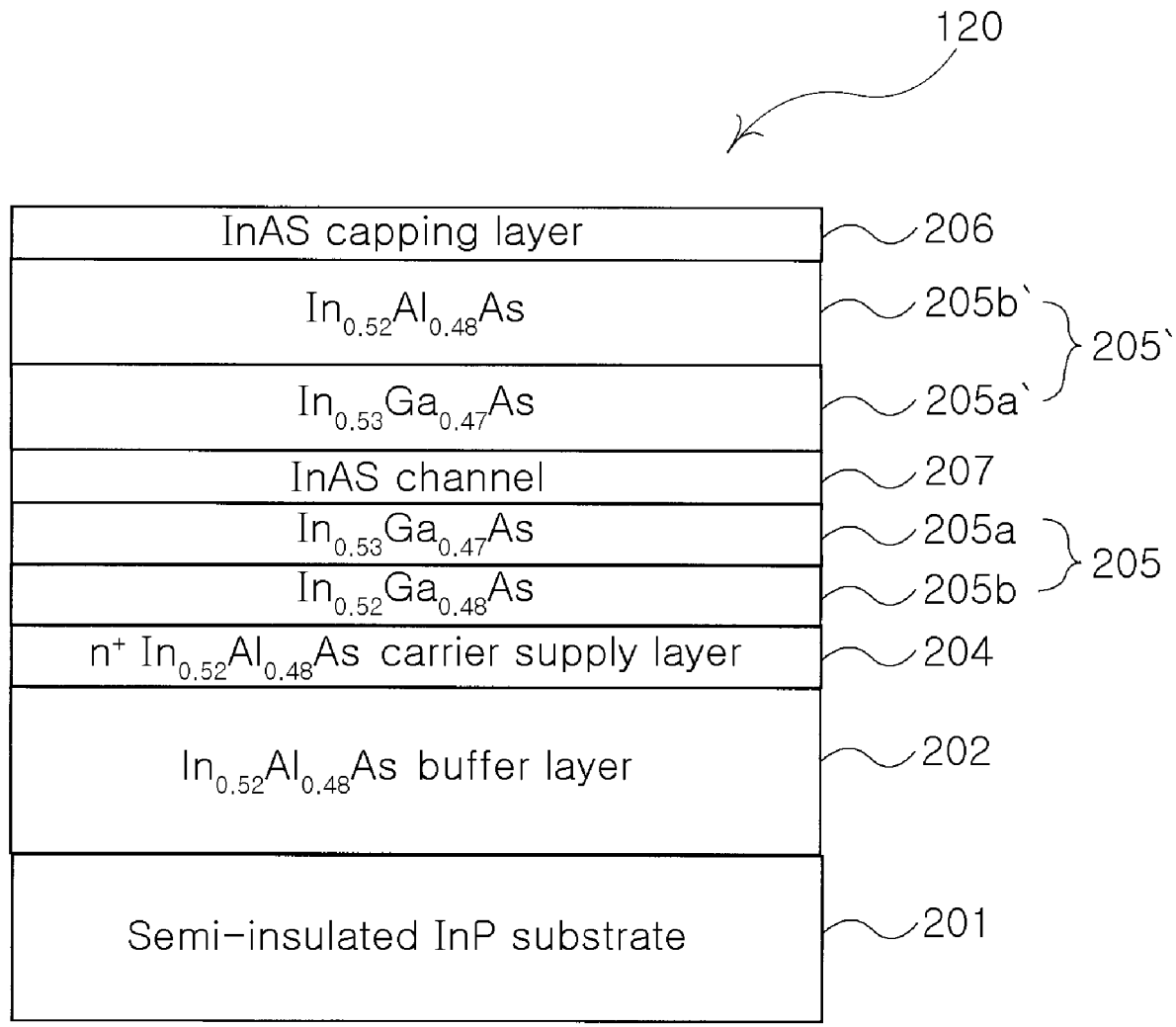
FIGS. 3A to 3C are cross-sectional views illustrating various channel structures for achieving a spin Hall effect according to an embodiment of the present invention.

FIG. 3A illustrates a semiconductor substrate for a read operation for forming a spin channel used in a magnetic memory device according to an embodiment of the present invention. Referring to FIG. 3A, a semiconductor substrate 120 includes a semi-insulated InP substrate 201, an InAlAs buffer layer 202, an $n^{31}$ doped InAlAs charge supply layer 204, an undoped InGaAs/InAlAs lower clad layer 205, an InAs channel layer 207, an undoped InAlAs/InGaAs upper clad layer 205', and an InAs capping layer 206 that are sequentially laminated on the semi-insulated InP substrate 201. Herein, the InAs channel layer 207 corresponds to the channel 107 of FIGS. 1A, 1B, 2A and 2B.

Each of the lower and upper cladding layers 205 and 205' is formed of a dual cladding structure including an undoped InGaAs layer and an InAlAs layer. That is, the lower cladding layer 205 includes a first lower cladding layer 205a formed of InGaAs and a second lower cladding layer 205b formed of InAlAs under the first lower cladding layer 205a. Also, the upper cladding layer 205' includes a first upper cladding layer 205a' formed of InGaAs and a second upper cladding layer 205b'. The second lower cladding layer 205b has a larger energy band gap than the first lower cladding layer 205a, and the second upper cladding layer 205b' has a larger energy band gap than the first upper cladding layer 205a'.

The channel layer 207 forms a quantum well by an energy barrier of the lower and upper cladding layers 205 and 205'. Specifically, electrons are confined by the lower and upper cladding layers 205 and 205' of a dual cladding structure, and channel layer 207 forms a two-dimensional electron gas (2-DEG) layer. In the two-dimensional electron gas layer, the electron mobility is very high and also the spin-orbit coupling effect is very high. In the present embodiment, the channel layer 207 is formed of InAs, to which the present invention is not limited. For example, the channel layer 207 may be of GaAs, InGaAs or InSb.

The $n^-$ doped InAlAs charge supply layer 204 is formed under the channel layer 207 to supply electric charges to the channel layer 207, and the InAlAs buffer layer 204 reduces a lattice mismatch between the InP substrate 201 and the lower cladding layer 205. Also, the InAs capping layer 206 formed at the top of the substrate 120 prevents the oxidation and degradation of the semiconductor substrate 120 that may occur during the fabrication process.

Figure 3B:
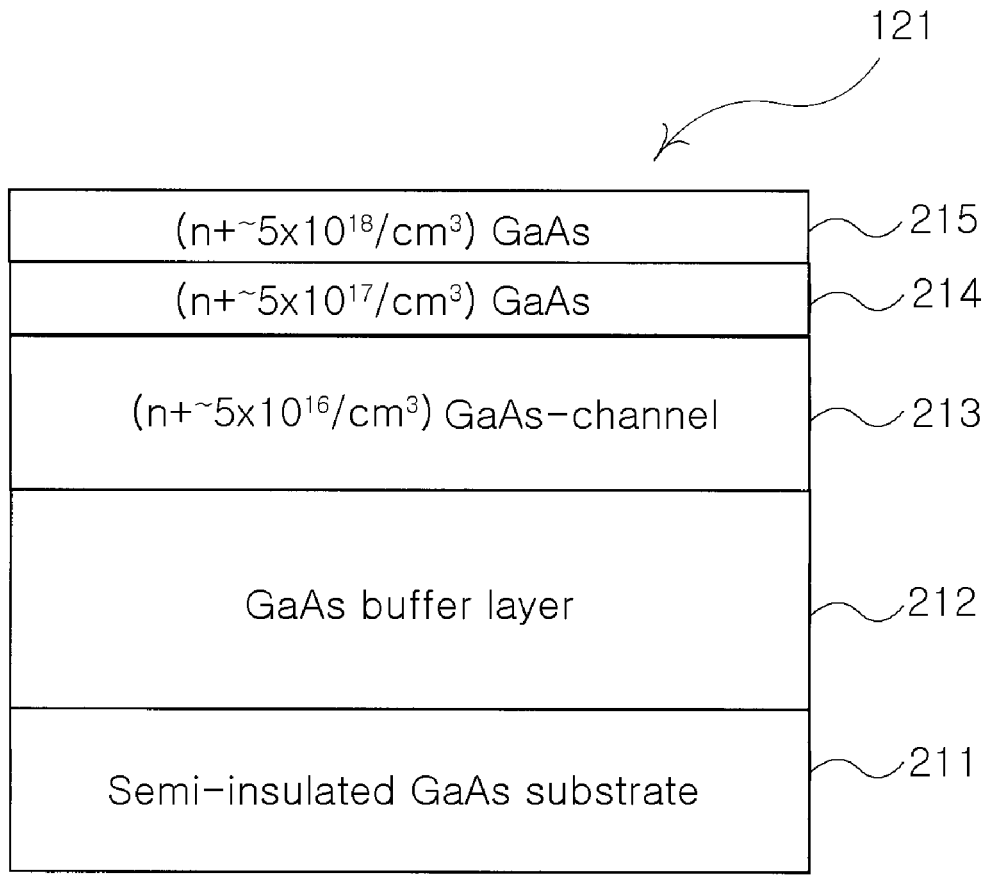

FIG. 3B illustrates another example of a substrate for forming a spin channel used in a magnetic memory device according to an embodiment of the present invention. Referring to FIG. 3B, a semiconductor substrate 121 includes a semi-insulated GaAs substrate 211, a GaAs buffer layer 212, and a channel layer 213 that are formed on the semi-insulated GaAs substrate 211. The channel layer 213 maybe used as the channel 107 of FIGS. 1A, 1B, 2A and 2B. Upper layers 214 and 215 on the channel layer 213 will be used to form a Schottky barrier and a ferromagnetic material of a memory cell. The channel layer 213 may be an undoped GaAs layer or an $Al_{0.3}Ga_{0.7}As$ layer.

Figure 3C:
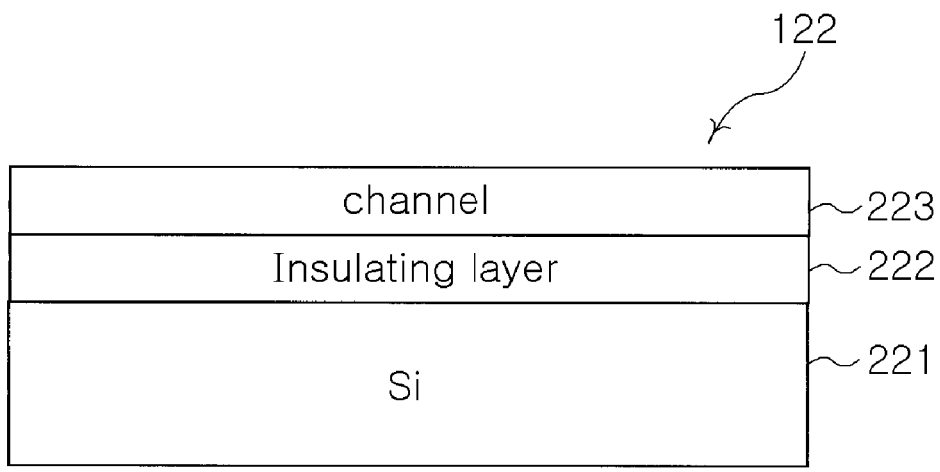

FIG. 3c illustrates a further another example of a substrate for forming a spin channel used in a magnetic memory device according to an embodiment of the present invention. Referring to FIG. 3C, a substrate 122 includes a single-layer spin channel 223. The spin channel 223 may be used as the channel 107 of FIGS. 1A, 1B, 2A and 2B. The spin channel 223 may be formed using any metal, semiconductor or semi-metal that provides a spin Hall effect. For example, the metal channel may be formed using Au, Pt, Ag, Al or Cu. For example, the semi-metal channel may be formed using Sb. For example, the semiconductor channel may be formed using GaAs, InAs, InGaAs or InSb. As illustrated in FIG. 3C, an insulating layer 222 may be disposed between the channel 223 and a silicon layer 221. The insulating layer 222 may be formed of an insulating material such as $AlO_x$, MgO, or $SiO_2$. The insulating layer 22 may be omitted.

FIGS. 4A to 4E are cross-sectional views illustrating a method for fabricating a magnetic memory device with a read unit according to an embodiment of the present invention. The illustration of FIGS. 4A to 4E focuses on a method for fabricating a read unit for reading stored data, and a process for fabricating a storage unit or a magnetic memory cell may vary depending on the storage method. Thus, the read unit fabricated for the present embodiment can be used for any magnetic memory cell, and FIGS. 4A to 4E illustrates a device with a two-dimensional electron gas layer structure as an example.

Figure 4A:
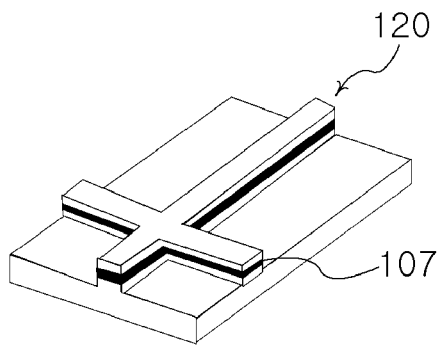
FIGS. 4A to 4E are perspective views illustrating a process for fabricating a magnetic memory device according to an embodiment of the present invention.

Referring to FIG. 4A, a multi-layer semiconductor substrate 120 as illustrated in FIG. 3A is formed, and a lithograph process and an ion-milling process are used to removed both sides of the semiconductor substrate, thereby forming a ridge structure at the substrate. The ridge structure constrains a two-dimensional electron gas channel layer 107. The channel layer 107 may be formed to a width of about 40 nm to about 100 nm. For easy measurement of a voltage (i.e., a spin Hall voltage) across both ends of channel width, the ridge structure may have a cross-shaped top portion in such a way that a lengthwise elongated portion and a widthwise elongated portion of the channel layer 107 cross each other (see FIGS. 1A, 1B, 2A, 2B and 4A). A spin Hall voltage can be measured across both ends of the widthwise elongated portion of the channel layer 107.

Figure 4B:
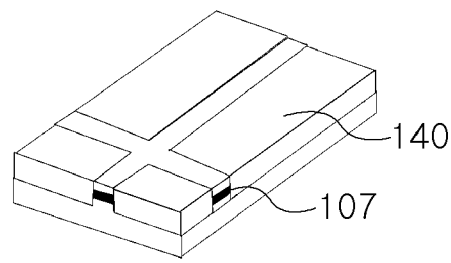

Referring to FIG. 4B, an insulating layer 140 is formed on both sides (removed portions) of the ridge structure in the resulting structure of FIG. 4A for planarization. For example, the insulating layer 140 may be formed of an oxide material such as TaO$_x$ or SiO$_2$. The insulating layer 140 may provide the insulation from a neighboring (corresponding to the channel) channel.

Figure 4C:
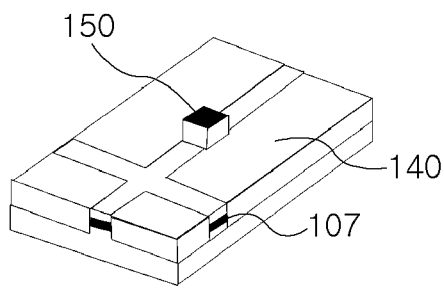

Referring to FIG. 4C, an electron beam lithograph process and a sputtering process are used to deposit a memory cell (i.e., a storage unit of the magnetic memory device) 150 on the channel layer 107. As illustrated in FIGS. 1A, 1B, 2A and 2B, the memory cell 150 may be formed of a single pattern of a ferromagnetic material of a multi-layer structure of ferromagnetic material/tunnel barrier layer/ferromagnetic material. A variety of other layers may be formed to improve the performance of the memory device. Because the present invention focuses on a read unit for reading data stored in a magnetic memory cell 150 and a read method thereof, a method for fabricating the magnetic memory cell 150 is not described in detail but the present invention can be applied to read all magnetic memory cells including pre-existing magnetic memory cells. The ferromagnetic portions used in the magnetic memory cell 150 (e.g., the pinned layer 101 and the free layers 102a and 102b of FIGS. 1A, 1B, 2A and 2B) may be formed of a ferromagnetic metal material selected from the group consisting of Fe, Co, Ni, CoFe, NiFe, and a combination thereof. Alternatively, the ferromagnetic portions used in the magnetic memory cell 150 may be formed using a magnetic semiconductor material such as (Ga, Mn)As or (In, Mn)As. The tunnel barrier layer (e.g., a reference numeral 103 of FIGS. 1A and 1B) may be formed using Al$_2$O$_3$ or MgO.

Figure 4D:
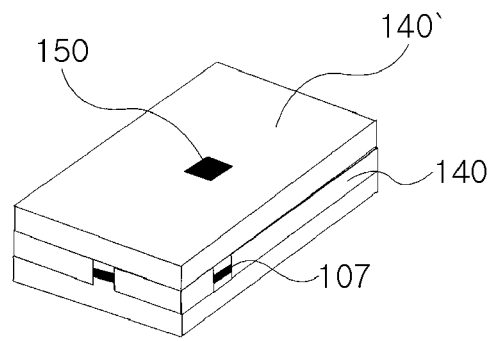

Referring to FIG. 4D, after the formation of the memory cell 150, an outside of the memory cell 150 (i.e., a portion without a memory cell) is filled with an insulating layer 140' to formed a planarized structure. The insulating layer 140' may be formed using an oxide material such as TaO$_x$ or SiO$_2$.

Figure 4E:
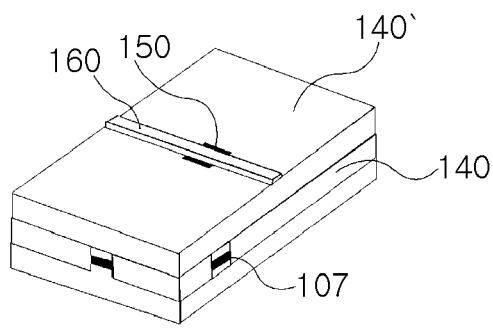

Referring to FIG. 4E, a metal line 160 serving as a bit line is formed on the resulting structure of FIG. 4D. The metal line 160 is used as a simple bit line for spin transfer switching, but is also used as a current line for switching the memory cell 150 by generating a magnetic field in the magnetic memory device that performs a switching operation by a magnetic field generated from a current.

Figure 5:
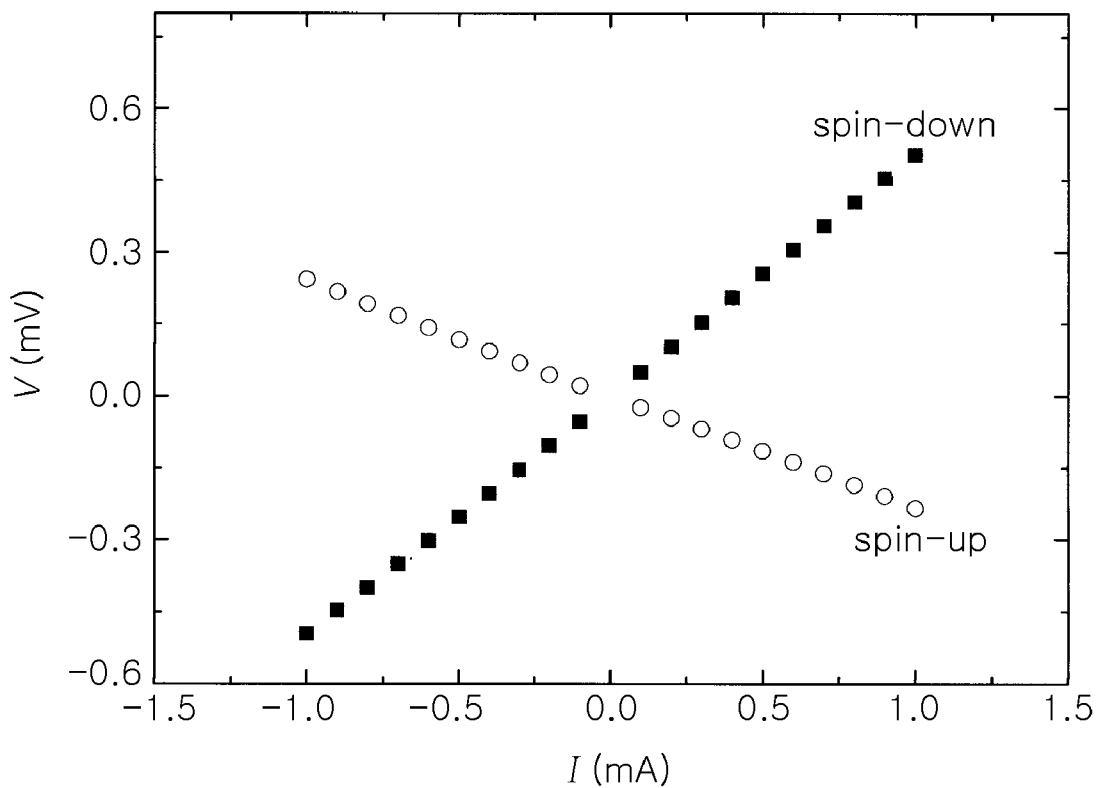
FIG. 5 is a graph showing the relationship between a channel current and a measured voltage depending on the magnetization direction of a magnetic memory cell in a magnetic memory device according to an embodiment of the present invention.

FIG. 5 is a graph showing the relationship between a current and a voltage (i.e., a spin Hall voltage) depending on the magnetization direction of a magnetic memory cell, as a result of an experimental on a memory device structure as illustrated in FIGS. 1A and 1B. As shown in the graph of FIG. 5, the slopes of the current-voltage graphs are opposite between the case where the spin direction of the free layer is the +z direction (i.e., spin-down) and the case where the spin direction of the free layer is the −z direction (i.e., spin-up). The reason for this is that the deviating direction of the electron varies depending on the magnetization direction of the magnetic memory cell as described above (see FIGS. 1A and 1B).

Figure 6:
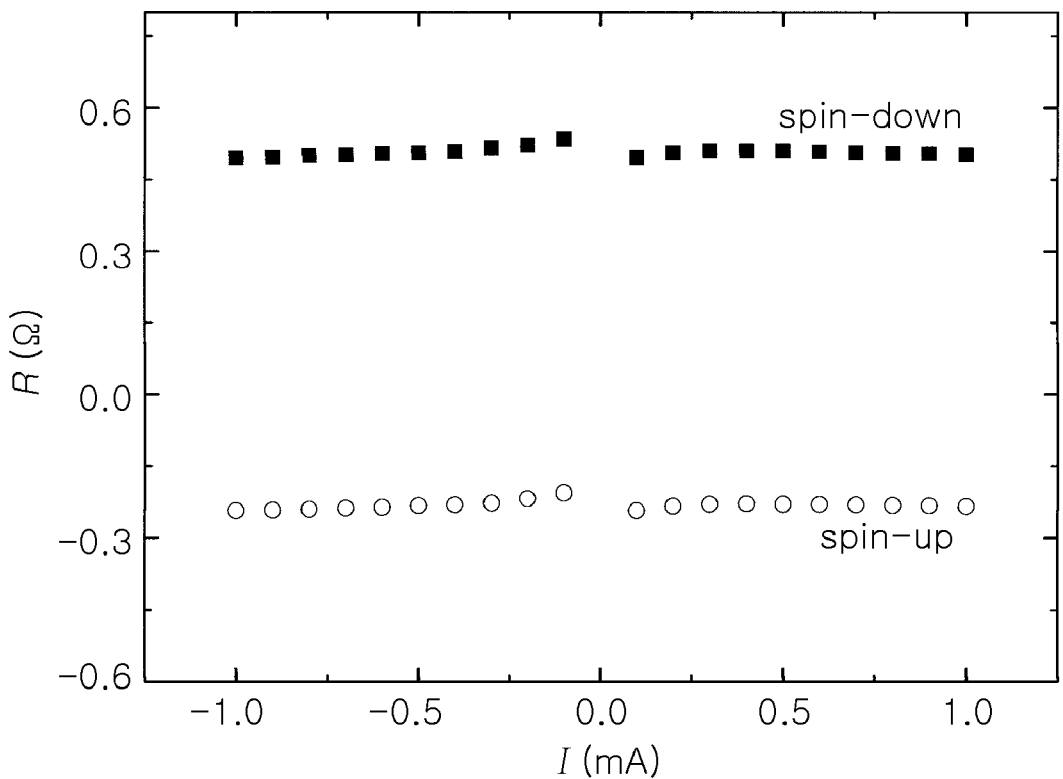
FIG. 6 is a graph showing the relationship between a channel current and a spin Hall resistance depending on the magnetization direction of a magnetic memory cell in a magnetic memory device according to an embodiment of the present invention.

FIG. 6 shows the results of FIG. 5 in terms of a Hall resistance. As shown in FIG. 6, a positive or negative Hall resistance is measured throughout the total current region, depending on the magnetization direction of the magnetic memory cell, regardless of the current intensity, which can be easily used to accurately read the state of the memory.

As described above, the present invention makes it possible to easily read data of a magnetic memory cell in a relatively simple structure by using a spin Hall effect, thus providing a good cost competitiveness. Also, the present invention makes it possible to remove a tunneling layer (i.e., a magnetic tunneling junction) necessary for a read operation in a memory device not using a spin torque. Accordingly, the present invention can reduce the power consumption necessary for a switching operation by reducing the resistance value of the device, and also can conveniently implement a high-density memory device by reducing the size of a transistor for driving the memory device. Also, the present invention makes it possible to read stored data by positive and negative voltage values without the need of a reference resistance even in a magnetic memory device using a spin torque. When the output are generated in the form of positive and negative values, it can be used as an input in the next stage, thus making it possible to provide easy combination of logic circuits.

While the present invention has been shown and described in connection with the exemplary embodiments, it will be apparent to those skilled in the art that modifications and variations can be made without departing from the spirit and scope of the invention as defined by the appended claims.

What is claimed is:

1. A magnetic memory device comprising:
a substrate having a channel layer formed therein; and
a magnetic memory cell formed on the substrate and having a magnetized magnetic material that transfers spin data to electrons passing the channel layer,
wherein data stored in the magnetic memory cell are read by a voltage across both side ends of the channel layer that is generated when the electrons passing the channel layer deviate in the widthwise direction of the channel layer by a spin Hall effect.

2. The magnetic memory device of claim 1, wherein the magnetization direction of the magnetic material of the magnetic memory cell is perpendicular to the top surface of the channel layer, the electrons with the spin data of the magnetic material is injected from the magnetic material into the channel layer in a read operation of the magnetic memory cell, and the deviating direction of the electrons in the widthwise direction of the channel layer changes depending on the spin direction of the injected electrons.

3. The magnetic memory device of claim 1, wherein the magnetization direction of the magnetic material of the magnetic memory cell is in-plane direction of the top surface of the channel layer and is parallel to the lengthwise direction of the channel layer; and
the spin direction of the electrons passing the channel layer is aligned by a stray magnetic field of the magnetic material perpendicular to the top surface of the channel layer in a read operation of the magnetic memory cell, and the deviating direction of the electrons in the widthwise direction of the channel layer changes depending on the aligned electron spin direction.

4. The magnetic memory device of claim 1, wherein in a read operation of the magnetic memory cell, a polarity of the voltage across the both side ends of the channel layer changes as the deviating direction of the electrons in the widthwise direction of the channel layer changes.

5. The magnetic memory device of claim 1, wherein the magnetic material of the magnetic memory cell is formed of one selected from the group consisting of CoFe, Co, Ni, NiFe, and a combination thereof.

6. The magnetic memory device of claim 1, wherein the magnetic material of the magnetic memory cell is formed of one selected from the group consisting of (Ga, Mn)As, (In, Mn)As, and a combination thereof.

7. The magnetic memory device of claim 1, wherein the magnetic memory cell has a multilayer structure of ferromagnetic material/tunnel barrier/ferromagnetic material.

8. The magnetic memory device of claim 1, wherein the magnetic memory cell has a single pattern structure of ferromagnetic material.

9. The magnetic memory device of claim 1, wherein the channel layer is a two-dimensional electron gas layer.

10. The magnetic memory device of claim 9, wherein the two-dimensional electron gas layer is formed of one selected from the group consisting of GaAs, InAs, InGaAs, InSb, and a combination thereof.

11. The magnetic memory device of claim 9, wherein the substrate comprises a lower cladding layer and an upper cladding layer for sandwiching the channel layer forming the two-dimensional electron gas layer;

the lower cladding layer comprises a first lower cladding layer and a second lower cladding layer formed under the first lower cladding layer, the second lower cladding layer having a larger energy band gap than the first lower cladding layer; and the upper cladding layer comprises a first upper cladding layer and a second upper cladding layer formed on the first upper cladding layer, the second upper cladding layer having a larger energy band gap than the first upper cladding layer.

12. The magnetic memory device of claim 11, wherein the channel layer is formed of InAs, the first lower cladding layer and the first upper cladding layer are formed of undoped InGaAs, and the second lower cladding layer and the second upper cladding layer are formed of undoped InAlAs.

13. The magnetic memory device of claim 1, wherein the substrate has a ridge structure obtained by removing both sides along the lengthwise direction of the channel layer, the channel width is limited by the ridge structure, and an insulating layer for planarization is formed at the removed both sides of the ridge structure.

14. The magnetic memory device of claim 13, wherein the ridge structure has a cross-shaped top portion in such a way that a lengthwise elongated portion and a widthwise elongated portion of the channel layer cross each other, and a voltage across both ends of the widthwise elongated portion is read as stored data.

15. A method for reading data stored in a magnetic memory cell, comprising:

disposing a magnetic memory cell with a magnetized magnetic material on a substrate with a channel layer to transfer spin data to electrons passing the channel layer; and reading a voltage across both side ends of the channel layer using a spin Hall effect by the electrons passing the channel layer in a read operation of the magnetic memory cell to read the data stored in the magnetic memory cell.

16. The method of claim 15, wherein the magnetization direction of the magnetic material of the magnetic memory cell is one of a spin-down direction and a spin-up direction perpendicular to the top surface of the channel layer, the electrons with the spin data of the magnetic material are injected from the magnetic material into the channel layer in the read operation of the magnetic memory cell, and the deviating direction of the electrons injected into the channel layer changes depending on the spin direction of the electrons to read the voltage.

17. The method of claim 15, wherein the magnetization direction of the magnetic material of the magnetic memory cell is in-plane direction of the top surface of the channel layer and is one of two opposite directions parallel to the lengthwise direction of the channel layer, and a stray magnetic field of the magnetic material perpendicular to the top surface of the channel layer is used to change the deviating direction of the electrons passing the channel layer according to the spin direction of the electrons, to read the voltage.

* * * * *